(12) United States Patent
Morikazu et al.

(10) Patent No.: US 9,349,646 B2
(45) Date of Patent: May 24, 2016

(54) WAFER PROCESSING METHOD INCLUDING A FILAMENT FORMING STEP AND AN ETCHING STEP

(71) Applicant: Disco Corporation, Tokyo (JP)

(72) Inventors: Hiroshi Morikazu, Tokyo (JP); Noboru Takeda, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/185,189

(22) Filed: Feb. 20, 2014

(65) Prior Publication Data

US 2014/0248757 A1 Sep. 4, 2014

(30) Foreign Application Priority Data

Mar. 1, 2013 (JP) ................................. 2013-041019

(51) Int. Cl.
  *H01L 21/00* (2006.01)
  *H01L 21/78* (2006.01)
  *B23K 26/00* (2014.01)
  *B23K 26/06* (2014.01)

(52) U.S. Cl.
  CPC ................ *H01L 21/78* (2013.01); *B23K 26/00* (2013.01); *B23K 26/0648* (2013.01)

(58) Field of Classification Search
  CPC ..... H01L 21/78; B23K 26/00; B23K 26/0648
  See application file for complete search history.

(56) References Cited

U.S. PATENT DOCUMENTS

| | | | |
|---|---|---|---|
| 5,486,264 A | 1/1996 | Ghandour | |
| 6,665,050 B2 | 12/2003 | Shiraishi | |
| 6,992,026 B2 * | 1/2006 | Fukuyo et al. | 438/797 |
| 2004/0002199 A1 * | 1/2004 | Fukuyo et al. | 438/460 |
| 2005/0272223 A1 * | 12/2005 | Fujii et al. | 438/459 |
| 2007/0004179 A1 * | 1/2007 | Nakamura et al. | 438/460 |
| 2009/0266802 A1 * | 10/2009 | Sawabe et al. | 219/121.67 |
| 2010/0136766 A1 * | 6/2010 | Sakamoto et al. | 438/463 |
| 2013/0126573 A1 | 5/2013 | Hosseini | |

FOREIGN PATENT DOCUMENTS

| | | |
|---|---|---|
| JP | 10-305420 | 11/1998 |
| JP | 2002-192370 | 7/2002 |
| JP | 2003-163323 | 6/2003 |
| JP | 2007-067082 | 3/2007 |
| JP | 2007-330985 | 12/2007 |

OTHER PUBLICATIONS

Berthold A, et al, Proceedings of the SeSens Workshop, (2010) pp. 613-616.
U.S. Appl. No. 14/188,896, filed Feb. 25, 2014.

* cited by examiner

*Primary Examiner* — Caleb Henry
*Assistant Examiner* — Alexander Belousev
(74) *Attorney, Agent, or Firm* — Greer Burns & Crain, Ltd.

(57) ABSTRACT

A wafer processing method for dividing a wafer along a plurality of division lines to obtain a plurality of individual chips. The wafer processing method includes a filament forming step of applying a pulsed laser beam having a transmission wavelength to the wafer along each division line in the condition where the focal point of the pulsed laser beam is set inside the wafer in a subject area to be divided, thereby forming a plurality of amorphous filaments inside the wafer along each division line, and an etching step of etching the amorphous filaments formed inside the wafer along each division line by using an etching agent to thereby divide the wafer into the individual chips along the division lines.

8 Claims, 6 Drawing Sheets

WAFER PROCESSING METHOD INCLUDING A FILAMENT FORMING STEP AND AN ETCHING STEP

BACKGROUND OF THE INVENTION

1. Field of the Invention

The present invention relates to a wafer processing method for dividing a wafer such as a semiconductor wafer and an optical device wafer along a plurality of division lines to obtain a plurality of individual chips.

2. Description of the Related Art

As well known in the art, in a semiconductor device fabrication process, a functional layer composed of an insulating film and a functional film is formed on the front side of a substrate such as a silicon substrate, and a plurality of semiconductor devices such as ICs and LSIs are formed like a matrix from this functional layer, thus obtaining a semiconductor wafer having the plural semiconductor devices. The plural semiconductor devices are partitioned by a plurality of crossing division lines formed on the front side of the semiconductor wafer. The semiconductor wafer is divided along these division lines to obtain the individual semiconductor devices as chips.

Further, in an optical device fabrication process, an optical device wafer is provided by forming an optical device layer composed of an n-type nitride semiconductor layer and a p-type nitride semiconductor layer on the front side of a sapphire substrate or a silicon carbide substrate. The optical device layer is partitioned by a plurality of crossing division lines to define a plurality of regions where a plurality of optical devices such as light emitting diodes and laser diodes are respectively formed. The optical device wafer is cut along the division lines to thereby divide the regions where the optical devices are formed from each other, thus obtaining the individual optical devices as chips.

As a method of dividing a wafer such as a semiconductor wafer and an optical device wafer along the division lines, there has been tried a laser processing method of applying a pulsed laser beam having a transmission wavelength to the wafer along the division lines in the condition where the focal point of the pulsed laser beam is set inside the wafer in a subject area to be divided. More specifically, this wafer dividing method using laser processing includes the steps of applying a pulsed laser beam having a transmission wavelength to the wafer from one side of the wafer along the division lines in the condition where the focal point of the pulsed laser beam is set inside the wafer to thereby continuously form a modified layer inside the wafer along each division line and next applying an external force to the wafer along each division line where the modified layer is formed to be reduced in strength, thereby dividing the wafer into the individual devices (see Japanese Patent No. 3408805, for example).

As another method of dividing a wafer such as a semiconductor wafer and an optical device wafer along the division lines, there has been put into practical use a technique including the steps of applying a pulsed laser beam having an absorption wavelength to the wafer along the division lines to thereby form a laser processed groove along each division line by ablation and next applying an external force to the wafer along each division line where the laser processed groove is formed as a break start point, thereby breaking the wafer along each division line (see Japanese Patent Laid-open No. Hei 10-305420, for example).

SUMMARY OF THE INVENTION

In forming a modified layer inside a wafer in the condition where the focal point of a laser beam is set inside the wafer, it is necessary to use a focusing lens having a numerical aperture (NA) of about 0.8. Accordingly, to divide a wafer having a thickness of 300 μm, for example, into individual devices, a plurality of modified layers stacked must be formed along each division line, causing a reduction in productivity. Further, in the case of applying a pulsed laser beam having an absorption wavelength to a wafer, ablation occurs near the surface of the wafer irradiated with the pulsed laser beam, so that the energy of the pulsed laser beam does not penetrate into the inside of the wafer. Accordingly, the pulsed laser beam must be applied plural times along each division line, causing a reduction in productivity. In addition, debris may scatter in performing the ablation to cause degradation in quality of each chip.

It is therefore an object of the present invention to provide a wafer processing method which can efficiently divide a wafer into individual chips along division lines and can also prevent degradation in quality of each chip.

In accordance with an aspect of the present invention, there is provided a wafer processing method for dividing a wafer along a plurality of division lines to obtain a plurality of individual chips, the wafer processing method including a filament forming step of applying a pulsed laser beam having a transmission wavelength to the wafer along each division line in the condition where the focal point of the pulsed laser beam is set inside the wafer in a subject area to be divided, thereby forming a plurality of amorphous filaments inside the wafer along each division line; and an etching step of etching the amorphous filaments formed inside the wafer along each division line by using an etching agent to thereby divide the wafer into the individual chips along the division lines.

Preferably, the pulsed laser beam to be applied in the filament forming step is focused by a focusing lens, and the numerical aperture (NA) of the focusing lens is set in the range of 0.1 to 0.3.

As described above, the wafer processing method according to the present invention includes the filament forming step of applying a pulsed laser beam having a transmission wavelength to a wafer along each division line in the condition where the focal point of the pulsed laser beam is set inside the wafer in a subject area to be divided, thereby forming a plurality of amorphous filaments inside the wafer along each division line, and the etching step of etching the amorphous filaments formed inside the wafer along each division line by using an etching agent to thereby divide the wafer into the individual chips along the division lines. The filaments formed inside the wafer along the division lines are etched off in the etching step. Accordingly, no processing strain is left in the wafer to thereby improve the die strength of each chip obtained by dividing the wafer. Further, while either side of the wafer to which the etching agent is supplied is also etched by the etching agent, the etch rate for this etching agent supply side of the wafer is about 1/10 of the etch rate for the amorphous filaments. That is, the etching agent supply side of the wafer is slightly etched to rather provide a merit that processing strain such as grinding strain left on the etching agent supply side of the wafer can be removed to thereby improve the die strength of each chip.

Further, each amorphous filament formed in the filament forming step extends from the laser beam applied surface (upper surface) of the wafer to the lower surface thereof. Accordingly, even when the thickness of the wafer is large, it is sufficient to once apply the pulsed laser beam along each division line, so that the productivity can be greatly improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
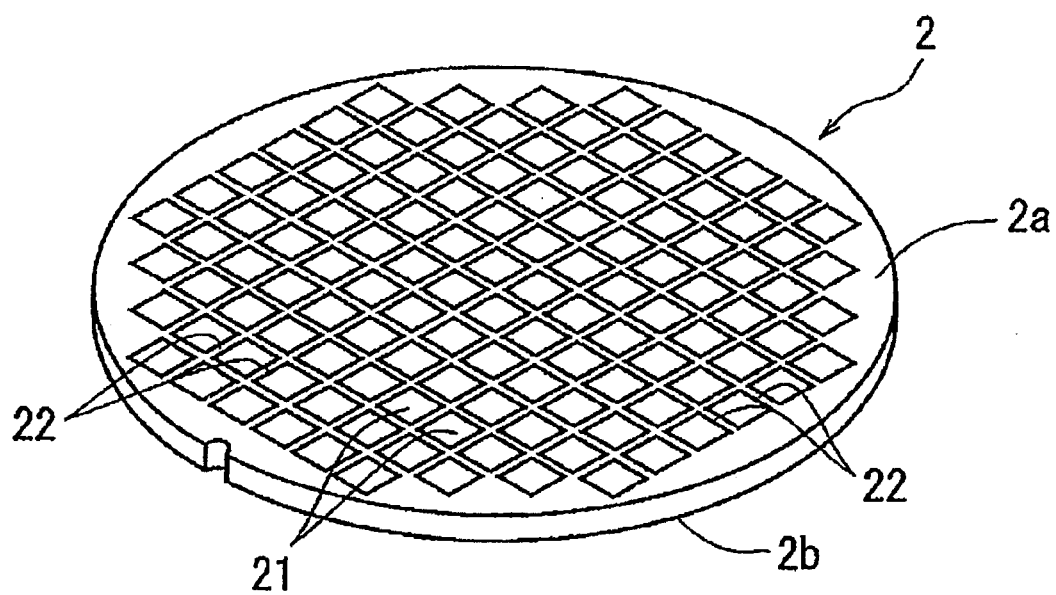
FIG. 1 is a perspective view of an optical device wafer to be processed by the wafer processing method according to the present invention.

The wafer processing method according to the present invention will now be described in detail with reference to the attached drawings. FIG. 1 is a perspective view of an optical device wafer 2 as a wafer to be processed by the wafer processing method according to the present invention. The optical device wafer 2 shown in FIG. 1 is composed of a sapphire substrate having a thickness of 300 μm, for example, and a plurality of optical devices 21 such as light emitting diodes and laser diodes formed on the front side 2a of the sapphire substrate so as to be arranged like a matrix. These optical devices 21 are partitioned by a plurality of crossing division lines 22 called streets formed on the front side 2a of the sapphire substrate, i.e., the front side of the optical device wafer 2. While the division lines 22 are clearly formed on the front side 2a of the optical device wafer 2 as shown in FIG. 1, there is also a case that division lines are not clearly formed on a glass plate or the like as the wafer. In this case, the division lines are set at the positions spaced predetermined distances from a predetermined position.

Figure 2A:
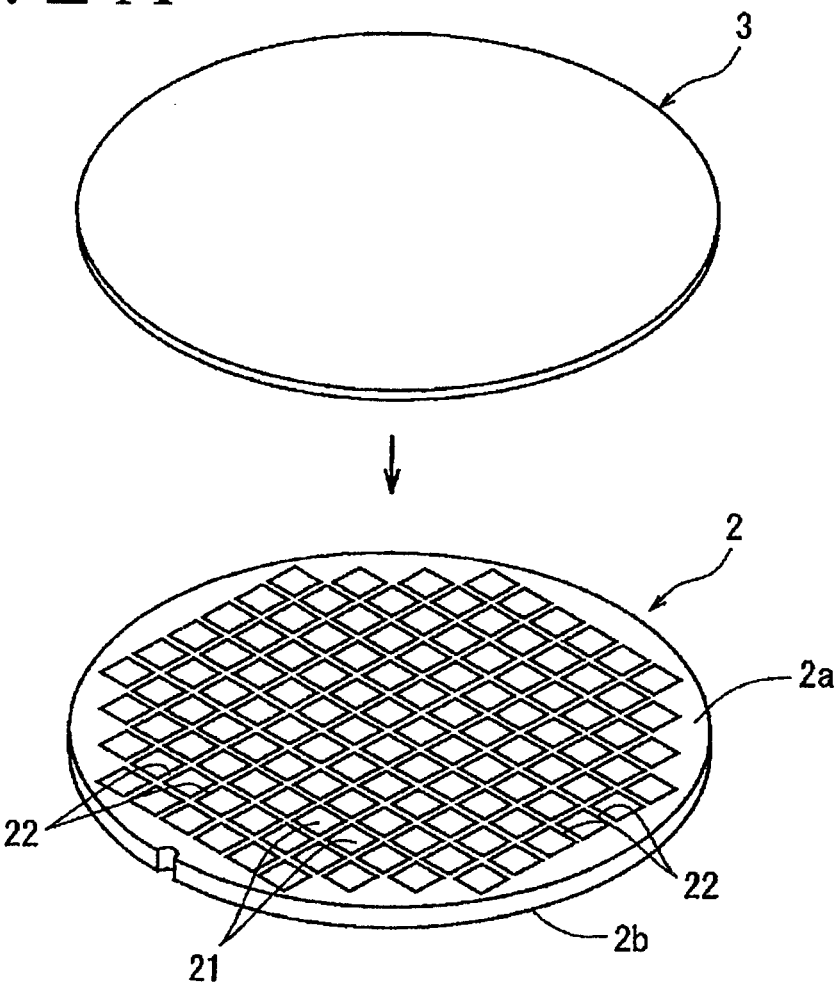
FIGS. 2A and 2B are perspective views for illustrating a protective member attaching step.
Figure 2B:
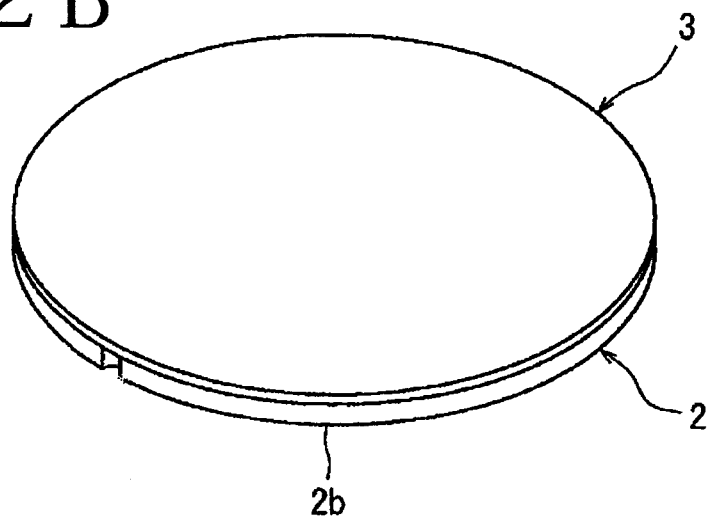

There will now be described a wafer processing method for dividing the optical device wafer 2 along the division lines 22. First, a protective member attaching step is performed in such a manner that a protective member is attached to the front side 2a of the optical device wafer 2 to protect the optical devices 21 formed on the front side 2a of the optical device wafer 2. More specifically, as shown in FIGS. 2A and 2B, a protective tape 3 as the protective member is attached to the front side 2a of the optical device wafer 2. The protective tape 3 is composed of a base sheet and an adhesive layer formed on the base sheet. For example, the base sheet has a thickness of 100 μm and it is formed of polyvinyl chloride (PVC). The adhesive layer has a thickness of about 5 μm and it is formed of acrylic resin.

Figure 3:
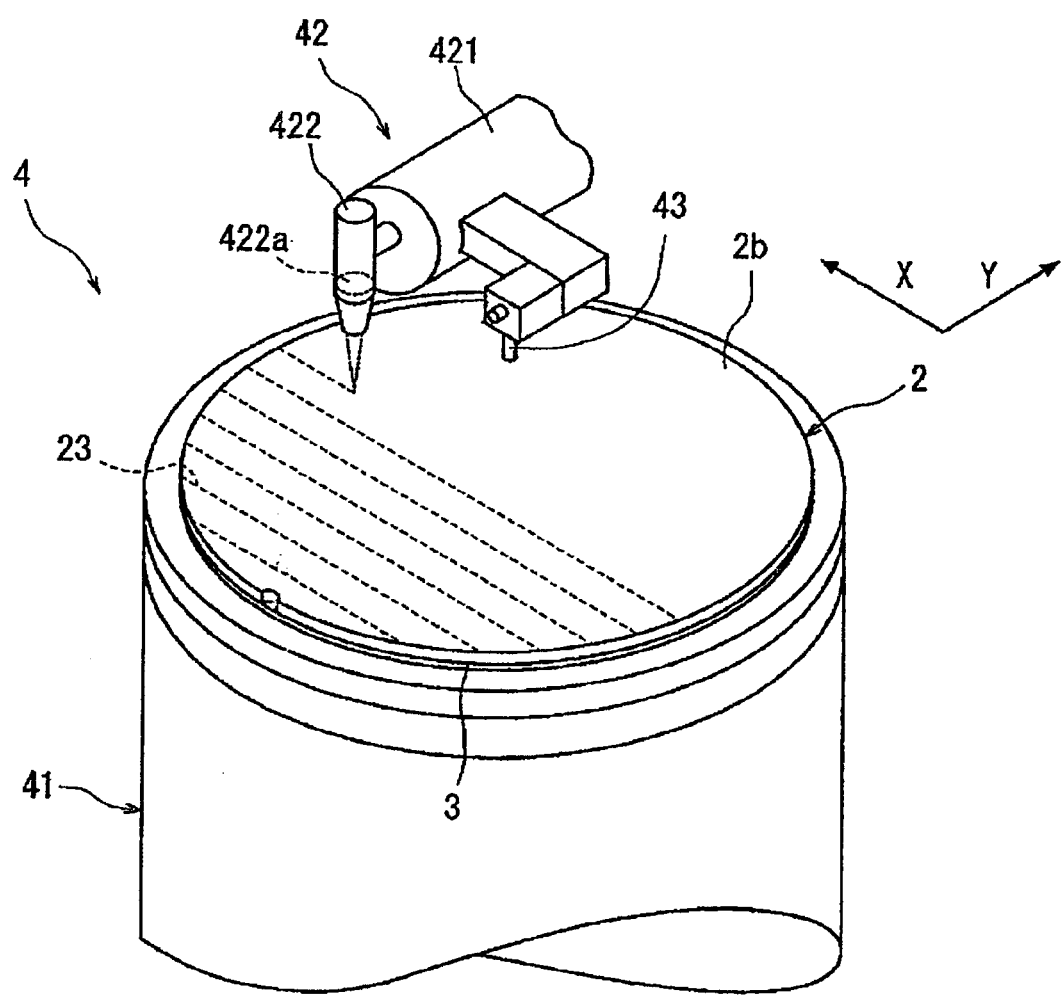
FIG. 3 is a perspective view of an essential part of a laser processing apparatus for performing a filament forming step.

After performing the protective member attaching step mentioned above, a filament forming step is performed in such a manner that a pulsed laser beam having a transmission wavelength to the sapphire substrate constituting the optical device wafer 2 is applied along each division line 22 in the condition where the focal point of the pulsed laser beam is set inside the wafer 2 in a subject area to be divided, thereby forming a plurality of amorphous filaments inside the wafer 2 along each division line 22. This filament forming step is performed by using a laser processing apparatus 4 shown in FIG. 3. As shown in FIG. 3, the laser processing apparatus 4 includes a chuck table 41 for holding a workpiece, laser beam applying means 42 for applying a laser beam to the workpiece held on the chuck table and imaging means 43 for imaging the workpiece held on the chuck table 41. The chuck table 41 has an upper surface as a holding surface for holding the workpiece thereon under suction. The chuck table 41 is movable both in the feeding direction shown by an arrow X in FIG. 3 by feeding means (not shown) and in the indexing direction shown by an arrow Y in FIG. 3 by indexing means (not shown).

The laser beam applying means 42 includes a cylindrical casing 421 extending in a substantially horizontal direction. Although not shown, the casing 421 contains pulsed laser beam oscillating means including a pulsed laser beam oscillator and repetition frequency setting means. The laser beam applying means 42 further includes focusing means 422 mounted on the front end of the casing 421. The focusing means 422 has a focusing lens 422a for focusing a pulsed laser beam oscillated by the pulsed laser beam oscillating means. It is important that the numerical aperture (NA) of the focusing lens 422a of the focusing means 422 is set in the range of 0.1 to 0.3. In this preferred embodiment, the numerical aperture (NA) of the focusing lens 422a is set to 0.25. The laser beam applying means 42 further includes focal position adjusting means (not shown) for adjusting the focal position of the pulsed laser beam to be focused by the focusing means 422.

The imaging means 43 is mounted on a front end portion of the casing 421 constituting the laser beam applying means 42 and includes illuminating means for illuminating the workpiece, an optical system for capturing an area illuminated by the illuminating means, and an imaging device (CCD) for imaging the area captured by the optical system. An image signal output from the imaging means 43 is transmitted to control means (not shown).

There will now be described with reference to FIG. 3 and FIGS. 4A to 4D the filament forming step of applying a pulsed laser beam having a transmission wavelength to the sapphire substrate constituting the optical device wafer 2 along each division line 22 by using the laser processing apparatus 4 mentioned above in the condition where the focal point of the pulsed laser beam is set inside the wafer 2 in a subject area to be divided, thereby forming a plurality of amorphous filaments along each division line 22. First, the optical device wafer 2 is placed on the chuck table 41 of the laser processing apparatus 4 in the condition where the protective tape 3 attached to the front side 2a of the optical device wafer 2 is in contact with the chuck table 41 as shown in FIG. 3. Thereafter, suction means (not shown) is operated to hold the optical device wafer 2 through the protective tape 3 on the chuck table 41 under suction (wafer holding step). Accordingly, the back side 2b of the optical device wafer 2 held on the chuck table 41 is oriented upward. Thereafter, the chuck table 41 holding the optical device wafer 2 is moved to a position directly below the imaging means 43 by operating the feeding means (not shown).

In the condition where the chuck table 41 is positioned directly below the imaging means 43, an alignment operation is performed by the imaging means 43 and the control means (not shown) to detect a subject area of the optical device wafer 2 to be laser-processed. More specifically, the imaging means 43 and the control means perform image processing such as pattern matching for making the alignment of the division lines 22 extending in a first direction on the optical device wafer 2 and the focusing means 422 of the laser beam applying means 42 for applying the laser beam to the wafer 2 along the division lines 22, thus performing the alignment of a laser beam applying position (alignment step). Similarly, this alignment step is performed for the other division lines 22 extending in a second direction perpendicular to the first direction on the optical device wafer 2.

Figure 4A:
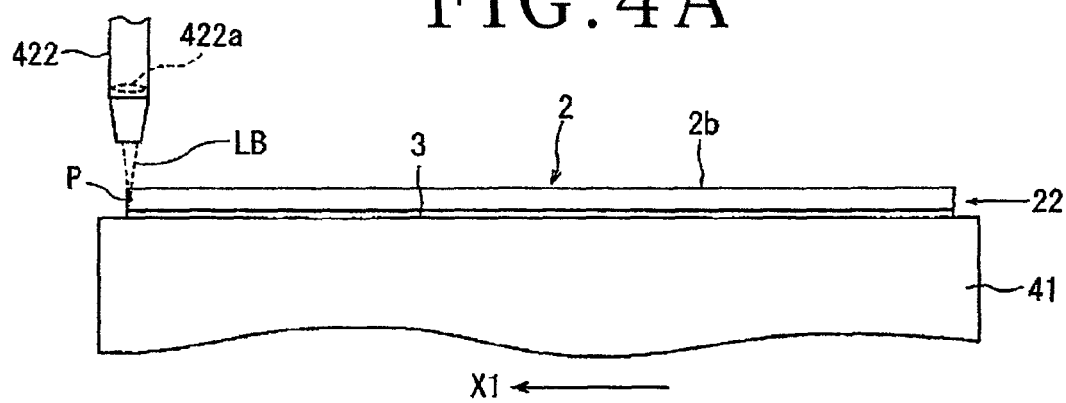
FIGS. 4A to 4D are views for illustrating the filament forming step.
Figure 4B:
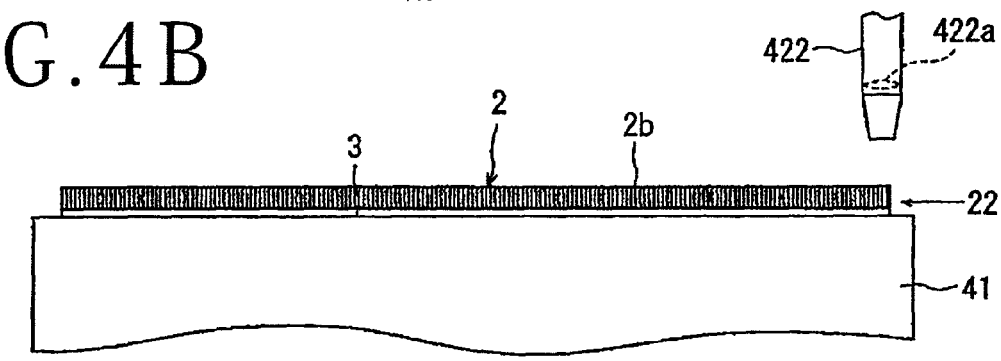
Figure 4C:
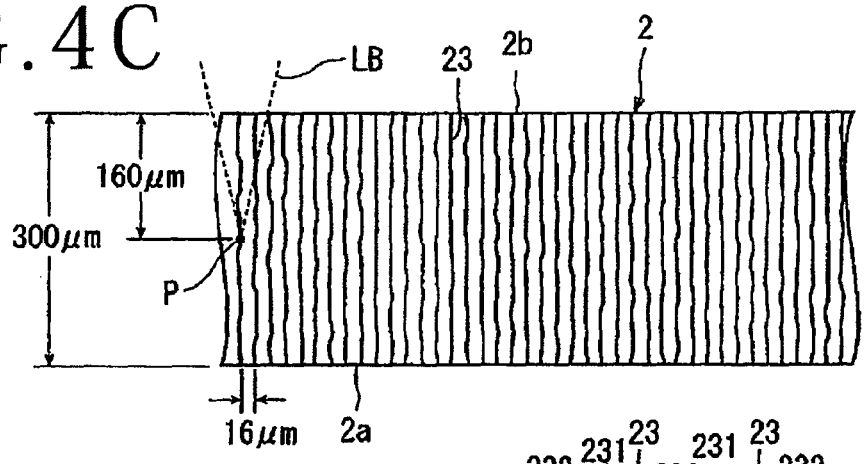

After performing the alignment step mentioned above for all of the division lines 22, the chuck table 41 is moved to a laser beam applying area where the focusing means 422 of the laser beam applying means 42 is located as shown in FIG. 4A, thereby positioning one end (left end as viewed in FIG. 4A) of a predetermined one of the division lines 22 extending in the first direction directly below the focusing means 422. Further, the focal point P of a pulsed laser beam LB to be applied from the focusing means 422 is set at an intermediate position in the direction along the thickness of the optical device wafer 2. More specifically, as shown in FIG. 4C, the focal point P of the pulsed laser beam LB is set at a position below the back side 2b (upper surface) of the optical device wafer 2 by 160 μm, wherein the pulsed laser beam LB is to be applied to the back side 2b of the wafer 2. Thereafter, the pulsed laser beam LB having a transmission wavelength to the sapphire substrate is applied from the focusing means 422 to the wafer 2, and the chuck table 41 is moved in the direction shown by an arrow X1 in FIG. 4A at a predetermined feed speed (filament forming step). When the other end (right end as viewed in FIG. 4A) of the predetermined division line 22 reaches the position directly below the focusing means 422 as shown in FIG. 4B, the application of the pulsed laser beam LB is stopped and the movement of the chuck table 41 is also stopped.

For example, the filament forming step mentioned above is performed under the following processing conditions.

Figure 4D:
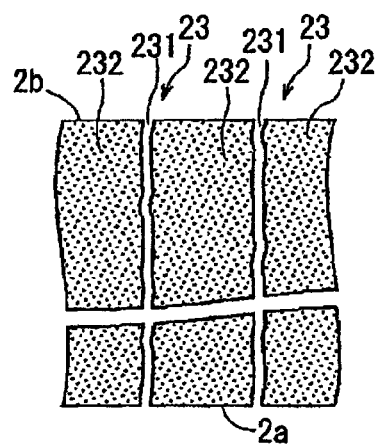

Wavelength: 1030 nm
Repetition frequency: 50 kHz
Pulse width: 10 ps
Average power: 3 W
Numerical aperture (NA) of the focusing lens: 0.25
Focused spot diameter: 10 μm
Focus: −160 μm (defocused on the laser beam applied surface)
Work feed speed: 800 mm/s By performing the filament forming step under the above-mentioned processing conditions, a plurality of amorphous filaments 23 are formed inside the optical device wafer 2 so as to extend from the back side 2b (upper surface) to the front side 2a (lower surface) in such a manner that the plural filaments 23 are arranged along the predetermined division line 22 at predetermined intervals, e.g., 16 μm intervals [=(work feed speed: 800 mm/s)/(repetition frequency: 50 kHz)] as shown in FIG. 4C. Each amorphous filament 23 is composed of a central fine hole 231 and an amorphous layer 232 formed around the central fine hole 231 as shown in FIG. 4D. In this preferred embodiment, the amorphous layers 232 of any adjacent ones of the amorphous filaments 23 are connected with each other. Each amorphous filament 23 formed by the filament forming step mentioned above extends from the laser beam applied surface (upper surface) of the optical device wafer 2 to the lower surface thereof. Accordingly, even when the thickness of the wafer 2 is large, it is sufficient to once apply the pulsed laser beam LB along each division line 22, so that the productivity can be greatly improved.

After performing the filament forming step along the predetermined division line 22 as mentioned above, the chuck table 41 is moved in the indexing direction shown by the arrow Y in FIG. 3 by the pitch of the division lines 22 formed on the optical device wafer 2 (indexing step), and the filament forming step is similarly performed along the next division line 22 extending in the first direction. In this manner, the filament forming step is performed along all of the division lines 22 extending in the first direction. Thereafter, the chuck table 41 is rotated 90 degrees to similarly perform the filament forming step along all of the other division lines 22 extending in the second direction perpendicular to the first direction.

After finishing the filament forming step mentioned above, an etching step is performed in such a manner that the filaments 23 formed inside the optical device wafer 2 by the filament forming step are etched by using an etching agent to thereby divide the optical device wafer 2 into the individual chips along the division lines 22. This etching step is performed by using an etching apparatus 5 shown in FIGS. 5A and 5B. The etching apparatus 5 includes a chuck table 51 for holding a workpiece under suction and an etching agent nozzle 52 for supplying an etching agent 50 in the form of a liquid to the workpiece held on the chuck table 51.

Figure 5A:
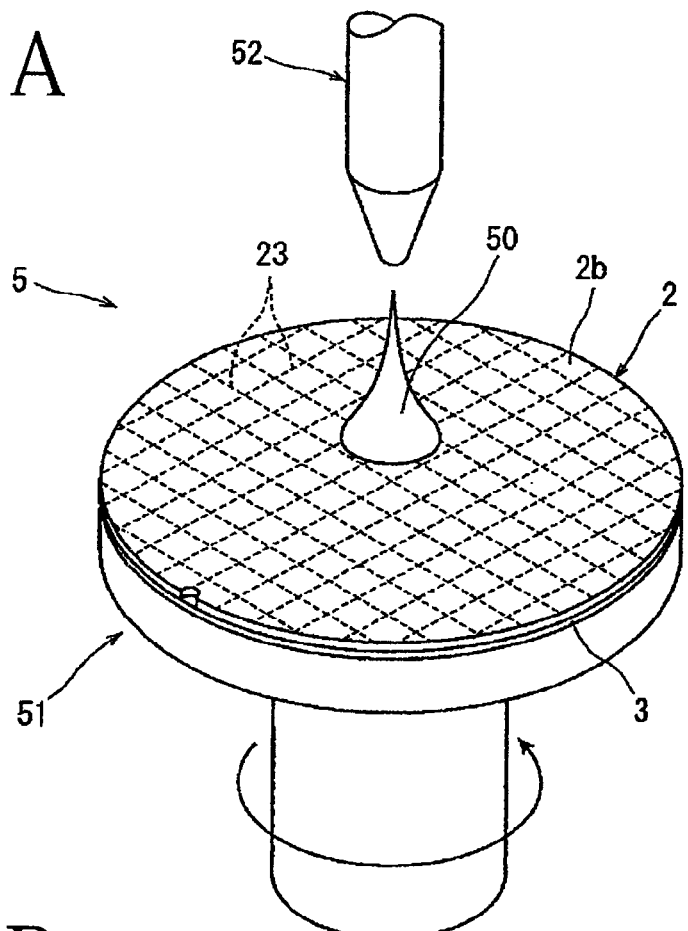
FIGS. 5A and 5B are perspective views for illustrating an etching step.
Figure 5B:
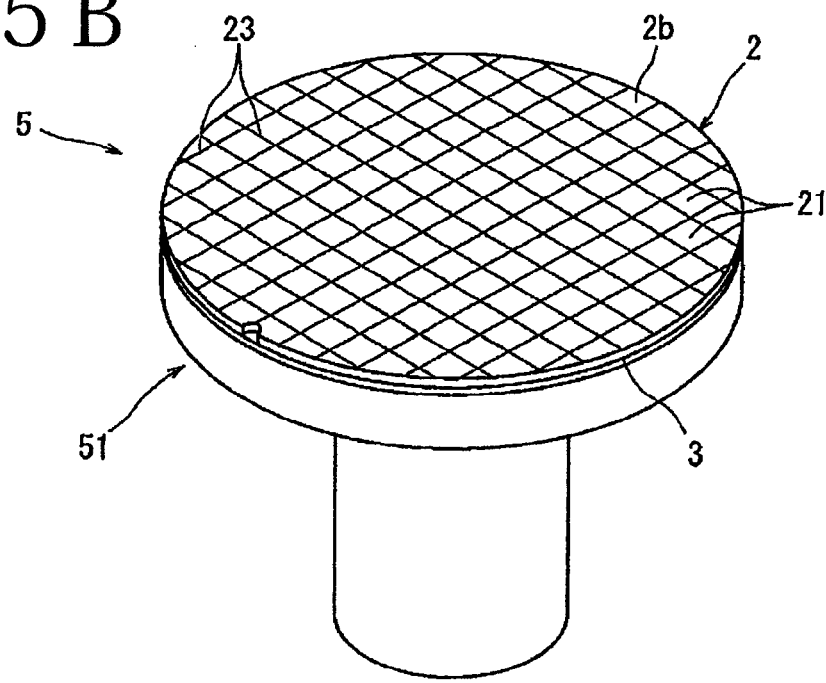

In performing the etching step by using the etching apparatus 5, the optical device wafer 2 processed by the filament forming step is first placed on the chuck table 51 of the etching apparatus 5 in the condition where the protective tape 3 attached to the front side 2a of the wafer 2 is in contact with the upper surface of the chuck table 51 as shown in FIG. 5A. Thereafter, suction means (not shown) is operated to hold the optical device wafer 2 through the protective tape 3 on the chuck table 51 (wafer holding step). Accordingly, the back side 2b of the optical device wafer 2 held on the chuck table 51 is oriented upward. Thereafter, the chuck table 51 is rotated at a speed of 10 to 60 rpm, for example, and the etching agent 50 for etching the filaments 23 formed inside the optical device wafer 2 is supplied from the etching agent nozzle 52 during the rotation of the chuck table 51. Examples of the etching agent 50 include hydrofluoric acid and concentrated sulfuric acid in the case that the optical device wafer 2 is formed from a sapphire substrate as in this preferred embodiment. In the case that the wafer in the present invention is formed from a silicon substrate, hydrofluoric acid or the mixture of hydrofluoric acid and nitric acid may be used. In the case that the wafer in the present invention is formed from a glass substrate, hydrofluoric acid or potassium hydroxide (KOH) may be used.

When the etching agent 50 is supplied from the etching agent nozzle 52 onto the back side 2b of the optical device wafer 2 held on the chuck table 51 in the condition where the chuck table 51 is rotated, the etching agent 50 quickly penetrates into the amorphous filaments 23 formed inside the wafer 2, thereby etching the amorphous filaments 23. As a result, the optical device wafer 2 is etched off along the division lines 22 where the filaments 23 are formed, so that the wafer 2 is divided along the division lines 22 to obtain the individual optical device chips 21.

As described above, the filaments 23 formed inside the optical device wafer 2 along the division lines 22 are etched off in the etching step mentioned above. Accordingly, no processing strain is left in the optical device wafer 2 to thereby improve the die strength of each optical device chip 21 obtained by dividing the wafer 2. Further, while the back side 2b of the optical device wafer 2 is also etched by the etching agent 50 in the above etching step, the etch rate for the back side 2b is about 1/10 of the etch rate for the amorphous filaments 23. That is, the back side 2b of the optical device wafer 2 is slightly etched to rather provide a merit that processing strain such as grinding strain left on the back side 2b of the optical device wafer 2 can be removed to thereby improve the die strength of each chip 21.

Figure 6:
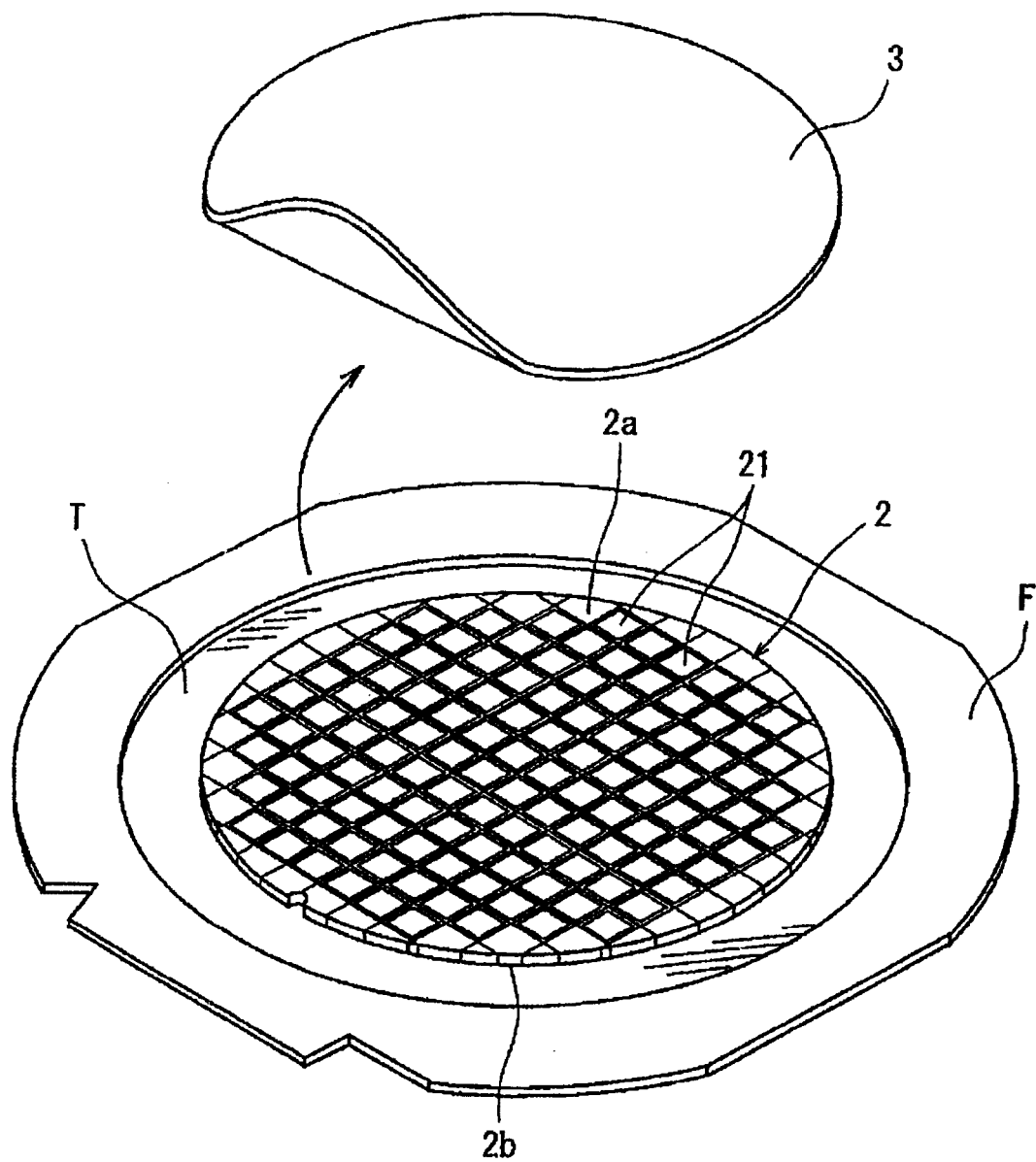
FIG. 6 is a perspective view for illustrating a wafer supporting step.

After performing the etching step mentioned above, a wafer supporting step is performed in such a manner that the back side 2b of the optical device wafer 2 divided into the individual optical device chips 21 is attached to an adhesive tape supported to an annular frame and that the protective tape 3 attached to the front side 2*a* of the optical device wafer 2 is next removed. More specifically, as shown in FIG. 6, the back side 2*b* of the optical device wafer 2 divided into the individual optical device chips 21 is attached to an adhesive tape T supported to an annular frame F. Accordingly, the protective tape 3 attached to the front side 2*a* of the optical device wafer 2 is oriented upward in the condition where the wafer 2 is attached to the adhesive tape T. Thereafter, the protective tape 3 as the protective member is peeled from the front side 2*a* of the optical device wafer 2. The optical device wafer 2 divided into the individual optical device chips 21 and supported through the adhesive tape T to the annular frame F as mentioned above is next transported to a pickup apparatus (not shown) for performing a pickup step.

While a specific preferred embodiment of the present invention has been described above, the present invention is not limited to the above preferred embodiment, but various modifications may be made within the scope of the present invention. For example, while the optical device wafer 2 formed from a sapphire substrate is divided into the individual optical device chips 21 in the above preferred embodiment, the wafer in the present invention may be formed from a silicon substrate or a glass substrate. Also in each case, the effects mentioned above can be obtained. Further, while the etching step in the above preferred embodiment is wet etching using the etching agent 50 in the form of a liquid, plasma etching using $SF_6$ or $C_4F_8$ may be performed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer along a plurality of division lines to obtain a plurality of individual chips, wherein said wafer includes an upper surface and a lower surface, said wafer processing method comprising:

a filament forming step of applying a pulsed laser beam having a transmission wavelength to said wafer along each division line in a condition where the focal point of said pulsed laser beam is set inside said wafer in a subject area to be divided, thereby forming a plurality of amorphous filaments inside said wafer along each division line, wherein said amorphous filaments are each composed of a hole and an amorphous layer formed around said hole, wherein the filament forming step is performed under processing conditions configured to result in the holes of said amorphous filaments being separated from each other at predetermined intervals; and an etching step of etching said amorphous filaments formed inside said wafer along each division line by using an etching agent to thereby divide said wafer into said individual chips along said division lines, wherein said pulsed laser beam to be applied in said filament forming step is focused by a focusing lens, and the numerical aperture of said focusing lens is set in the range of 0.1 to 0.3, and wherein each of the holes of the amorphous filaments and the amorphous layer extend from the upper surface of the wafer to the lower surface of the wafer, thereby extending completely through the wafer.

2. The wafer processing method according to claim 1, wherein the pulsed laser beam used during said filament forming step has a wavelength of 1030 nm and a focused spot diameter of 10 µm.

3. The wafer processing method according to claim 1, wherein the pulsed laser beam used during said filament forming step has a repetition frequency of 50 kHz and a pulse width of 10 ps.

4. The wafer processing method according to claim 1, wherein the pulsed laser beam used during said filament forming step is focused upon an intermediate position between the upper and lower surfaces of the wafer, whereby the pulsed laser beam is defocused on the lower surface of the wafer.

5. The wafer processing method according to claim 1, wherein a work feed speed of relative movement between said wafer and a laser beam applying means for applying said pulsed laser beam is 800 mm/s.

6. The wafer processing method according to claim 1, wherein each of the predetermined intervals is 16 µm.

7. The wafer processing method according to claim 1, wherein the amorphous layers of adjacent ones of the amorphous filaments are connected with each other.

8. The wafer processing method according to claim 1, wherein each of the holes is completely surrounded by the amorphous layer associated therewith.

* * * * *